(12) United States Patent
Su et al.

(10) Patent No.: US 8,426,980 B2
(45) Date of Patent: Apr. 23, 2013

(54) CHIP-TO-CHIP MULTI-SIGNALING COMMUNICATION SYSTEM WITH COMMON CONDUCTIVE LAYER

(75) Inventors: Chau-Chin Su, Taipei (TW);
Ying-Chieh Ho, Zhubei (TW);
Po-Hsiang Huang, Tainan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/210,818

(22) Filed: Aug. 16, 2011

(65) Prior Publication Data

US 2012/0091596 A1  Apr. 19, 2012

(30) Foreign Application Priority Data

Oct. 19, 2010  (TW) ................................ 99135525 A (51) Int. Cl.
*H01L 23/522* (2006.01)
(52) U.S. Cl.
USPC ............ 257/777; 257/E23.034; 257/E23.169; 257/E31.001; 257/E23.131; 257/E25.013; 257/E23.101; 257/686; 257/685; 257/723; 257/783; 257/724; 257/728; 257/737; 257/738; 257/778; 257/459; 257/784; 257/786
(58) Field of Classification Search .................. 257/777, 257/686, 685, 723, 783, 724, 728, 737, 734, 257/738, 778, E23.034, E23.169, E31.001, 257/459, E23.131, E25.013, E23.101, 784, 257/786
See application file for complete search history.

(56) References Cited

U.S. PATENT DOCUMENTS

| | | | | |
|---|---|---|---|---|
| 5,622,590 | A * | 4/1997 | Kunitomo et al. ............ | 156/291 |
| 6,046,910 | A * | 4/2000 | Ghaem et al. ................. | 361/760 |
| 6,121,689 | A * | 9/2000 | Capote et al. ................. | 257/783 |
| 6,597,019 | B2 * | 7/2003 | Inoue et al. .................... | 257/99 |
| 7,816,780 | B2 * | 10/2010 | Kajiwara et al. .............. | 257/692 |
| 8,039,304 | B2 * | 10/2011 | Pagaila ......................... | 438/107 |
| 2003/0032216 | A1 * | 2/2003 | Nakaoka et al. .............. | 438/106 |
| 2003/0127722 | A1 * | 7/2003 | Nakaoka et al. .............. | 257/686 |
| 2007/0090387 | A1 * | 4/2007 | Daniels et al. ................. | 257/99 |
| 2008/0165518 | A1 * | 7/2008 | Ichiryu et al. ................. | 361/803 |
| 2008/0186008 | A1 * | 8/2008 | Hirohashi et al. ............ | 323/355 |
| 2008/0308894 | A1 * | 12/2008 | Tsai et al. ..................... | 257/459 |
| 2009/0053859 | A1 * | 2/2009 | Xu et al. ....................... | 438/118 |
| 2009/0261483 | A1 * | 10/2009 | Katogi et al. ................. | 257/783 |
| 2010/0313667 | A1 * | 12/2010 | Terada et al. .................. | 73/754 |
| 2011/0031600 | A1 * | 2/2011 | Kim .............................. | 257/686 |
| 2011/0285007 | A1 * | 11/2011 | Chi et al. ...................... | 257/686 |

* cited by examiner

*Primary Examiner* — A O Williams
(74) *Attorney, Agent, or Firm* — Muncy, Geissler, Olds & Lowe, PLLC (57) ABSTRACT

A chip-to-chip multi-signaling communication system with common conductive layer, which comprises a first chip, a second chip, and a common conductive layer, is disclosed. The first chip has at least a first metal pad and a second metal pad. The second chip has at least a first metal pad and a second metal pad. The common conductive layer is to a conductive material and glued directly to the first chip and the second chip. Wherein, the first metal pad of the second chip is aligned with the first metal pad of the first chip for receiving the signal from the first metal pad of the first chip through the common conductive layer. The interference generated by other pads of the first and the second chips is suppressed by the design of the pads and the common conductive layer.

4 Claims, 5 Drawing Sheets

CHIP-TO-CHIP MULTI-SIGNALING COMMUNICATION SYSTEM WITH COMMON CONDUCTIVE LAYER

CROSS REFERENCE TO RELATED APPLICATION

This application claims the benefits of the Taiwan Patent Application Serial Number 99135525, filed on Oct. 19, 2010, the subject matter of which is incorporated herein by reference.

BACKGROUND OF THE INVENTION

1. Field of the Invention

The present invention relates to the technical field of chip-to-chip signal transmission and, more particularly, to a chip-to-chip multi-signaling communication system with common conductive layer.

2. Description of Related Art

With the rapid development of consumer products such as wireless networks, digital multimedia and the like, multiple modules are needed to be integrated into a single chip for system-on-chip (SoC), so as to relatively increase the complexity of the design of SoC. The concept for designing the SoC has faced lots of difficulty such as: the increasing chip area with the complexity, the parameter shifting of the chip, and the difficulty of integrating different fabricating techniques. The factors mentioned above are the principle reasons that the yield rate cannot be increased. At the same time, due to progress in packaging techniques for chips, SoC integration has turned from planar integration into 3D IC technology. 3D IC technology has already become the most plausible option for current IC industries to meet Moore's Law.

The 3D IC technology that developed currently was to reach the hetero-chip integration by stacking chips fabricated in different processes while in packaging stage. 3D IC technology, which is to integrate multiple chips vertically in three-dimensional space, was developed in order to achieve the most benefit for minimal size. Vertical conduction configuration is employed in 3D IC technology and is different from planar chip integration. In this case, the connection length and delay time between transistors are obviously shorter than the conventional 2D circuit. In addition, the chip performance is increased and the power consumption is reduced. Further, the noise coupling caused by the inductive and capacitive effects is much lower.

The 3D IC technology at present is generally system in package (SIP), which comprises technology such as stack die and flip-chip.

Figure 1:
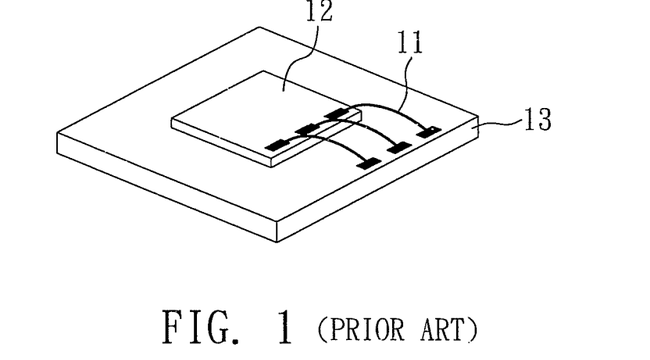
FIG. 1 is a perspective view of a traditional 3D IC configuration with wire bonding.

Although different types of chip connection are used in the typical 3D IC technology, for signal transmission, conventional point-to-point type is served. For example, FIG. 1 is a perspective view of a traditional 3D IC configuration with wire bonding. As shown in FIG. 1, wires 11 are incorporated for the connection between the chip 12 and the substrate 13. A large amount of space on a chip is required by the wires for wire bonding, which causes a large number of interconnections to be impossible, which in turn creates heavier load effect, and longer transmission distance have occurred.

Figure 2:
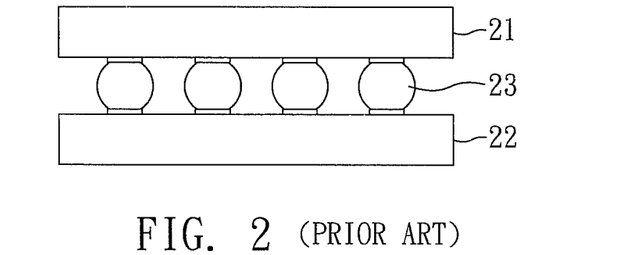
FIG. 2 is a perspective view of a traditional 3D IC configuration with flip chip solder bonding.

FIG. 2 is a perspective view of a typical 3D IC configuration with solder bonding of a flip chip technology. As shown in FIG. 2, the upper chip 21 connects with the lower chip 22 through the solder balls 23. Though the flip chip technology contains shorter distance connection (10-15 µm) and higher density connection, the problems of temperature and filling also exist in the back-end process, which therefore results in low yield rate and high cost expenditure.

Additionally, the capacitive coupling and the inductive coupling form the chip-to-chip connection which requires a larger metal area for on-chip capacitors and inductors. Complex circuit design for transmitter and receiver is another important issue. Further, the alignment of pads is also a problem.

No matter wire bonding technology, flip chip technology, or capacitive coupling and inductive coupling connection technology, their common purpose is to form the point-to-point signal communication path between the chips. Thus the traditional chip-to-chip communication system needs to be improved due to the disadvantages already mentioned above.

SUMMARY OF THE INVENTION

The object of the present invention is to provide a chip-to-chip multi-signaling communication system with common conductive layer, having the capability of signal transmitting and receiving at short distance, a large number of metallic pads can be disposed to allow a high chip-to-chip transmission density. In addition, the present invention presents no stress problem, therefore, no metallic pads are needed to enhance the stress while designing the system. Further, the chips are connected by conductive material of the present invention that allows the back-end process to be able to be omitted.

To achieve the object, the chip-to-chip multi-signaling communication system with common conductive layer as illustrated by the present invention comprises: a first chip, a second chip, and a common conductive layer. The first chip has at least a first pad and a second pad; the second chip has at least a first pad and a second pad as well. The common conductive layer is a conductive material and is glued directly to the first chip and the second chip; wherein the first pad of the second chip is aligned with the first pad of the first chip for receiving the signal from the first pad of the first chip through the common conductive layer. The interference generated by other pads of the first and the second chips is suppressed by the design of the pads and the common conductive layer.

DETAILED DESCRIPTION OF THE PREFERRED EMBODIMENT

Figure 3:
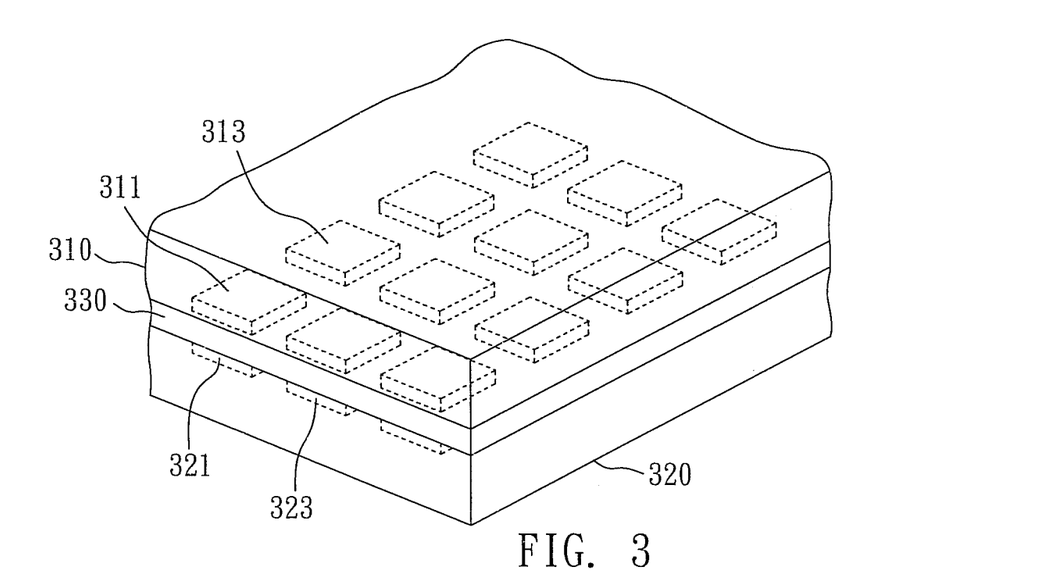
FIG. 3 is a perspective view of a chip-to-chip multi-signaling communication system with common conductive layer of the present invention.

FIG. 3 is a perspective view of a chip-to-chip multi-signaling communication system with common conductive layer 300 of the present invention. The system comprises a first chip 320, and a common conductive layer 330. The system 300 is to utilize conductive medium as the common conductive layer 330, letting the integrated circuit to connect interactively by the connection state of face-to-face. The signal is transmitted between the pads of the integrated circuit to communicate through the common conductive layer.

The first chip 310 and the second chip 320 have a plurality of pads respectively in the present embodiment. As the simplified perspective view of the system 300 shown in FIG. 4, the first chip 310 has at least a first pad 311 and a second pad 313, the second chip 320 has at least a first pad 321 and a second pad 323.

Figure 4:
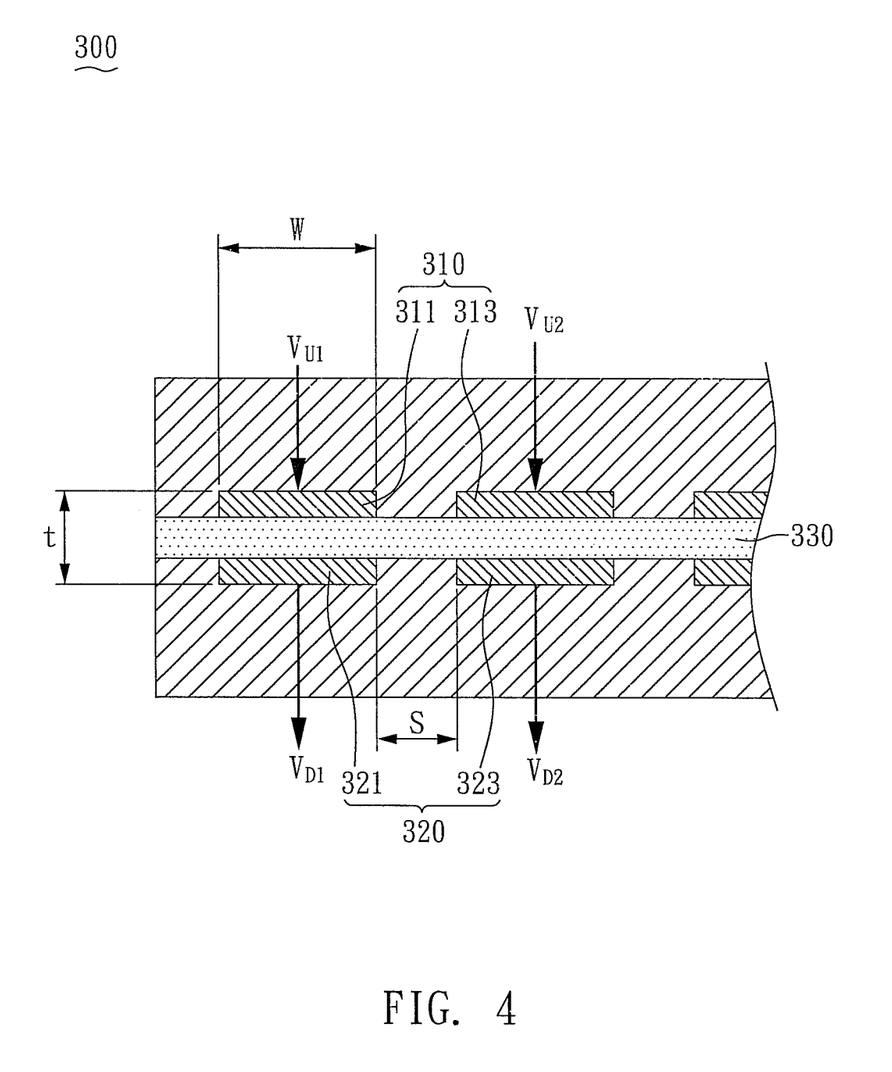
FIG. 4 is a simplified perspective view of a chip-to-chip multi-signaling communication system with common conductive layer of the present invention.

The common conductive layer 330 is conductive material and glues the first chip 310 and the second chip 320 directly. The common conductive layer 330 of the present invention is a medium layer composed of conductive medium. According to the requirement of practical performance, materials with different resistivity are selectable. The resistivity of different materials is relatively different. For example, upon the requirement of an IC itself, a material ranging from a pure silicon substrate with resistivity in an order of kOhm-cm to a conductive silver or carbon paste with resistivity of 0.0001 Ohm-cm is selectively for usage.

The material of the common conductive layer 330 contains the function of adhering the first chip 310 and the second chip 320 and of conduction. Such material is generally existent. For example, each kind of conductive glue is an option. Further, the conductivity of the conductive glue is to be the magnitude of the resistivity ρ, which can be adjusted by controlling the doping and the size of conductive particles.

The transmitting end integrated circuit (such as the first chip 310) transmits the signal from the pads at the most upper layer (in this case, the first pad 311 and the second pad 313 of the first chip) to the common conductive layer 330, also, the integrated circuit for receiving the signal (such as the second chip 320) receives the signal that is desired by the pads at the most lower layer (in this case, the first pad 321 and the second pad 323 of the second chip) which is separated by the common conductive layer 330 and aligned with the pads of the transmitting end. Wherein the first chip 310 and the second chip 320 is located at the top and the bottom of the common conductive layer 330 respectively. The first pad 321 of the second chip 320 is aligned with the first pad 311 of the first chip 310 for receiving the signal from the first pad 311 of the first chip 310 through the common conductive layer 330. The interference generated by other pads of the first chip 310 and the second chip 320 is able to be suppressed by the design of the pads and common conductive layer 330.

Accordingly, the signal is transmitted to the common conductive layer 330 from the first pad 311 and the second pad 313 of the first chip 310, the first pad 321 of the second chip 320 receives the signal from the common conductive layer 330.

To transmit the signal directly from the common conductive layer 330 indicates that the signal is first transmitted into the common conductive layer 330 under 3D IC configuration. As shown in FIG. 3, the first pad 311 and the second pad 313 of the first chip 310 at upper layer, while adhering, are aligned with the first pad 321 and the second pad 323 of the second chip 320 at lower layer respectively.

When signals $V_{U1}$ and $V_{U2}$ are transmitted from the first pad 311 and the second pad 313 of the first chip 310 to the first pad 321 and the second pad 323 of the second chip 320 through the common conductive layer 330 respectively, the first pad 321 of the second chip 320 receives signal $V_{U1}$ from the first pad 311 of the first chip 310 at the front side, but also receives signal $V_{U2}$ from the second pad 313 of the first chip 310 at the diagonal side. This means a component of signal $V_{U1}$ from the first pad 311 of the first chip and a component of signal $V_{U2}$ from the second pad 313 of the first chip exist simultaneously in signal $V_{D1}$ that is received by the first pad 321 of the second chip. In the above description, the signal $V_{U2}$ from the second pad 313 of the first chip is the unwanted noise to the first pad 321 of the second chip 320. Likewise, a component of signal $V_{U1}$ from the first pad 311 of the first chip and a component of signal $V_{U2}$ from the second pad 313 of the first chip exist simultaneously in signal $V_{D2}$ which is received by the second pad 323 of the second chip. Therefore, the signal $V_{U1}$ from the first pad 311 of the first chip is unwanted noise to the second pad 323 of the second chip 320.

Figure 5:
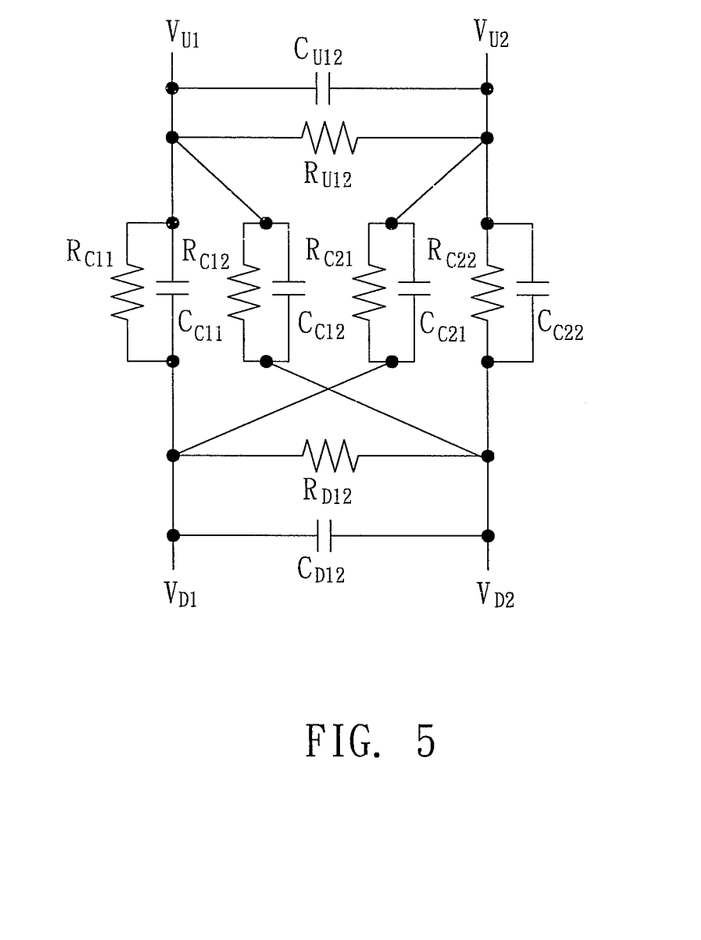
FIG. 5 is an equivalent network circuit diagram of a chip-to-chip multi-signaling communication system with common conductive layer of the present invention.

Further, leakage current occurs due to the common conductive layer 330 when the potential across $V_{U1}$、$V_{U2}$ and $V_{D1}$、$V_{D2}$ are different. Therefore, the signal transmission in FIG. 4 can be expressed by the interlaced network between the signal and the common conductive layer 330, the corresponding w、s、t, and the resistivity ρ of the common conductive layer 330, where the interlaced network between the signal and the common conductive layer 330 is composed of parasitic resistor and parasitic capacitor. FIG. 5 is an equivalent network circuit diagram of a chip-to-chip multi-signaling communication system with common conductive layer of the present invention.

The magnitude of the signal $V_{D1}$ received by the first pad of the second chip is a function of the dimension of the pads w, the spacing between the pads located on the first or the second chips, the thickness of the common conductive layer t and the arrangement of the pads. Thus the relationship between $V_U$、$V_{U2}$、$V_{D1}$、$V_{D2}$ is basically relevant to the equivalent circuit composed of those parameters which are to be w、s、t and the resistivity ρ of the common conductive layer, the relationship can be written as follow:

$$V_{D1}=\alpha(\rho,w,s,t)\cdot V_{U1}+\beta(\rho,w,s,t)\cdot V_{U2} \quad \text{(Formula 1); and}$$

$$V_{D2}=\alpha(\rho,w,s,t)\cdot V_{U2}+\beta(\rho,w,s,t)\cdot V_{U1} \quad \text{(Formula 2);}$$

wherein α and β are a ratio each changed with different parameter designs, w is the dimension of the pads, s is the spacing between the pads located on the first or the second chip, t is the thickness of the common conductive layer, and ρ is the resistivity of the common conductive layer.

From the equations, a general transmission formula for the pads of the schematic view of the system 300 of FIG. 3 can be expressed as follow:

$$V_{Dmn} = \beta_{mn}(\rho, w, s, t) \cdot V_{Umn} + \sum_{}^{i\neq m, j\neq n} \beta_{ij}(\rho, w, s, t) \cdot V_{Uij} \quad \text{(Formula 3)}$$

where $V_{Dmn}$ is the signal from one of the pads of the second chip, which receives the signal $V_{Umn}$ from one of the pads of the first chip.

Figure 6:
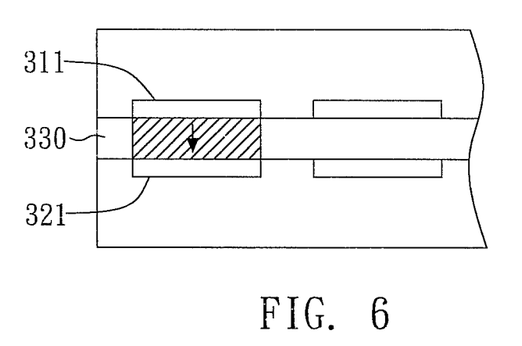
FIG. 6 is a perspective view of the face-to-face path resistance of the present invention.

When it comes to the resistance of the equivalent circuit in FIG. 5, it contains mainly three categories. As shown in FIG. 6, FIG. 6 is a perspective view of the face-to-face path resistance of the present invention. The path resistance of the signal transmission is indicated by arrow, the meaning of the path resistance that FIG. 6 would like to convey is the current flowing vertically downward from the first pad 311 of the first chip to the first pad 321 of the second chip through the common conductive layer 330, while the magnitude of the path resistance would have affected the operating speed of the signal directly. Where $R_{C11}$ is the equivalent resistance between the first pad 311 of the first chip and the second pad 321 of the second chip, and $R_{C12}$ is the equivalent resistance between the second pad 313 of the first chip and the second pad 323 of the second chip.

Figure 7:
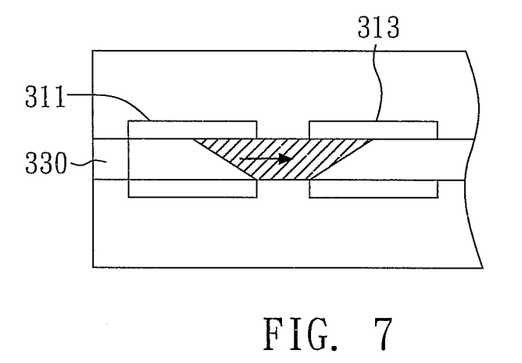
FIG. 7 is a perspective view of the current leakage path resistance in the same layer of the present invention.

FIG. 7 is a perspective view of the current leakage path resistance in the same layer of the present invention, the current leakage path resistance in the same layer is indicated by arrow, the meaning of the path resistance that FIG. 7 would like to convey is the current flowing horizontally from the first pad 311 of the first chip to the first pad 313 of the first chip through the common conductive layer 330. Where $R_{U12}$ is the equivalent resistance between the first pad 311 of the first chip and the second pad 313 of the first chip, and $R_{D12}$ is the equivalent resistance between the second pad 321 of the second chip and the second pad 323 of the second chip.

Figure 8:
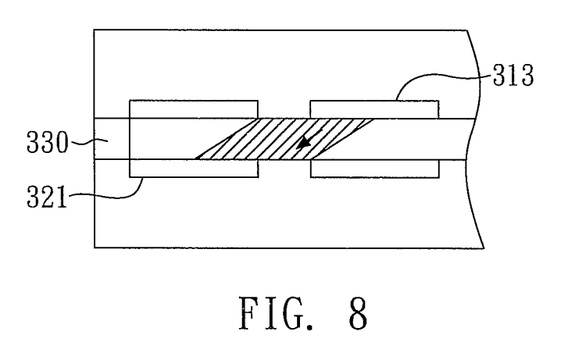
FIG. 8 is a perspective view of a path resistance of the interference signals of the present invention.

FIG. 8 is a perspective view of a path resistance of the interference signals of the present invention. The path resistance of the other interference signals is indicated by arrow, the meaning of the path resistance that FIG. 8 would like to convey is the current flowing diagonally from the second pad 313 of the first chip to the first pad 321 of the second chip through the common conductive layer 330. Where $R_{C21}$ is the equivalent resistance between the second pad 313 of the first chip and the first pad 321 of the second chip, and $R_{C12}$ is the equivalent resistance between the first pad 311 of the first chip and the second pad 323 of the second chip.

The capacitor analysis can be grouped into four categories: the first is the flat capacitor of the pad opposite to the path of the signal transmission; the second is the coupling capacitor between adjacent pads in a same layer; the third is the edge capacitor of the diagonal path; and the fourth is the ground capacitor for each pad to ground. Since the transient response is only affected by capacitors, all the capacitors shown in FIG. 5 are considered as open while analyzing the magnitude of the signal in steady state. The magnitude of the received $V_{D1}$ by the first pad 321 of the second chip can be simplified as the following approximation:

$$V_{D1} = \frac{(R_{M4} + R_{C22}) \| (R_{M3} + R_{C21})}{R_{M1} + (R_{M4} + R_{C22}) \| (R_{M3} + R_{C21})} \cdot \frac{R_{C21}}{R_{M3} + R_{C21}} \cdot \quad \text{(Formula 4)}$$

$$V_{U1} + \left[ \frac{R_{M1}}{R_{M1} + (R_{M4} + R_{C22}) \| (R_{M3} + R_{C21})} \cdot \right.$$

$$\left. \frac{R_{C21}}{R_{M3} + R_{C21}} + \frac{R_{M3}}{R_{M3} + R_{C21}} \right] \cdot V_{U2};$$

where $$R_{M1} \triangleq \frac{R_{c11} \cdot R_{c12}}{R_{c11} + R_{c12} + R_{D12}};$$

$$R_{M3} \triangleq \frac{R_{c11} \cdot R_{D12}}{R_{c11} + R_{c12} + R_{D12}}; \text{ and}$$

$$R_{M4} \triangleq \frac{R_{D11} \cdot R_{C11}}{R_{c11} + R_{c12} + R_{D12}};$$

where $R_{C11}$ is the equivalent resistance between the first pad 311 of the first chip and the second pad 321 of the second chip, $R_{C12}$ is the equivalent resistance between the second pad 313 of the first chip and the second pad 323 of the second chip, $R_{D12}$ is the equivalent resistance between the second pad 321 of the second chip and the second pad 323 of the second chip, $R_{C21}$ is the equivalent resistance between the second pad 313 of the first chip and the first pad 321 of the second chip, and $R_{C12}$ is the equivalent resistance between the second pad 313 of the first chip and the second pad 323 of the second chip.

When the parameters w, s, t, and ρ are appropriately designed and applied to the above equations, $V_{U1}$ can have an impact on $V_{D1}$ more than $V_{U2}$ on $V_{D1}$. For example, with ρ=333 ohm·cm, w=30 um, and s=t=2 um, $V_{D1} \approx 0.94 V_{U1} + 0.06 V_{U2}$ can be obtained.

In other words, the required parameters as defined in the specification of the present invention can be designed flexibly. Lower resistivity and decreased thickness of the common conductive layer are selected when high-speed transmission is required, otherwise, if low power consumption and low leakage current design are needed, it can be achieved by increasing the spacing between the pads and by increasing the resistivity between the pads adjacent to each other.

Table 1 is a comparison of various 3D transmission technology, which is based on signal transmitting/receiving capability, chip-to-chip transmission density, stress effect, power consumption, signal to noise ratio (SNR), and back-end process.

It is known from Table 1 that the invention has short distance signal transmitting/receiving capability. Also, with an appropriate parameter design, high SNR can be obtained, even though interference occurs in the adjacent channels due to common conduction. In addition, the invention allows a large number of pads to be placed, and thus has a high chip-to-chip transmission density. Further, the invention has no stress effect or problem, and in this case no metallic pads are needed to enhance the stress while designing the system. Furthermore, the invention uses an electric conduction material to glue the chips directly without other back-end processes. Finally, with the appropriate parameters of a conduction material, the static current consumption using the common conductive layer in this operation is minimal as compared with the static current consumption of the chips themselves.

From table 1, it is known that the present invention has the capability of short distance signal transmitting and receiving. Also, with appropriate parameter design, high SNR can be obtained even though interference occurs in the adjacent channels due to common conduction. Besides, a greater number of pads can be disposed to allow high transmission density between the chips in the present invention. Further, the present invention has no problem about stress effect of the pad-bonding, and in this case, there is no need for additional pads in design for enhancing the stress. Furthermore, the chips are glued by conductive material in the present invention, which results in the elimination of other back-end processes. Finally, though there is leakage current while the system is under operation, but with appropriate parameters of a conduction material, the static current consumption due to the common conductive layer can be minimalized as compared with the static current consumption of the chips themselves.

TABLE 1

|  | Wire bonding | Flip chip solder bonding | Coupling | The present invention |
|---|---|---|---|---|
| Capability of signal transmitting and receiving | point-to-point, long distance | point-to-point, short distance | point-to-point, short distance, interference | common conductive layer, short distance, interference |

TABLE 1-continued

|  | Wire bonding | Flip chip solder bonding | Coupling | The present invention |
|---|---|---|---|---|
| Chip-to-chip transmission density | low | high | middle | high |
| Stress effect | yes | yes | no | no |
| Power consumption | long wire | good | need of bias current | static current |
| SNR | very good | very good | good | good |
| Back-end process | few | complicated | few | few |

Figure 9:
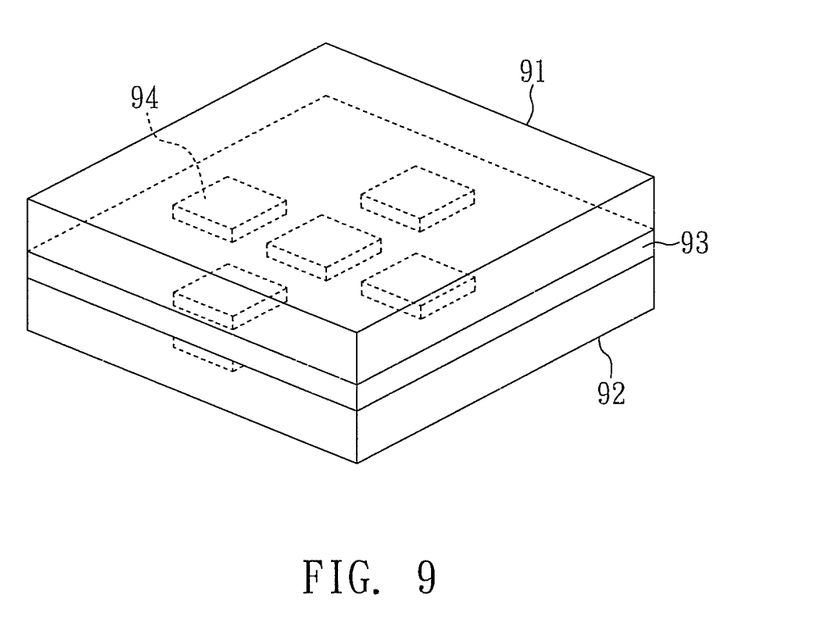
FIG. 9 is a perspective view of an interleaved arrangement for five pads.
Figure 10:
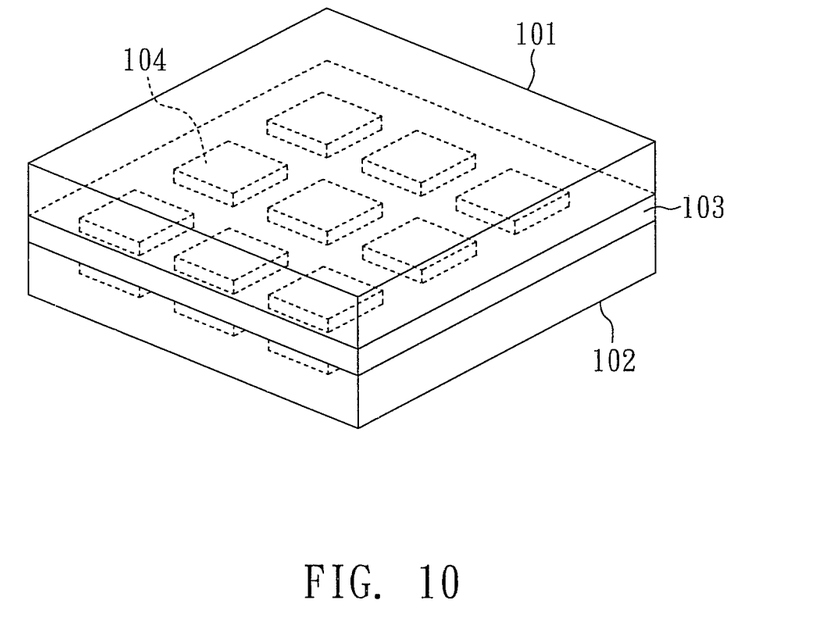
FIG. 10 is a perspective view of an interleaved arrangement for nine pads.

The present invention is appropriate for interleaved and non-interleaved arrangements which allow a flexible arrangement under more complex and greater signal requirement conditions without reducing the performance due to the different arrangements. FIG. 9 is a perspective view of an interleaved arrangement for five pads and FIG. 10 is a perspective view of an interleaved arrangement for nine pads.

As shown in FIG. 9, the first chip 91 comprises five pads 94 that are arranged in cross-shape, the second chip 92 comprises five pads that are also arranged in cross-shape to align with the pads of the first chip. The mechanism implied in FIG. 9 is just the same as the mechanism implied in FIG. 3, which has been fully depicted above so that the detailed description shall be omitted. Also, for FIG. 10, the first chip 101 comprises nine pads 104 that are arranged in nine-square division, the second chip 102 comprises nine pads that are also arranged in nine-square division to align with the pads of the first chip. The mechanism implied in FIG. 10 is just the same with the mechanism implied in FIG. 3, which has been fully depicted above so that the detailed description shall be omitted. Both 93 and 103 stands for common conductive layer in FIG. 9 and FIG. 10.

As cited, the inventive system uses an electric conduction agent such as conductive glue to glue the chips and form the common conductive layer, which is different from a conventional point-to-point input/output port. The mechanism of using the common conductive layer to transfer multiple signals between the chips in the present invention can transfer a signal directly to the common conductive layer, and then the receiver can selectively receive the required signals from the common conductive layer. The 3D IC stacking technology of the current invention with the common conductive layer in direct transmission has the following features—easy circuit design, not using multiple metallic layers to produce the pads in order to overcome stress, smaller chip pitch, available in high density interconnection, directly using a conductive medium instead of bonding without using complicated and expensive back-end processes—as compared with the existing 3D IC stacking technology.

From the above description, it is known that the chip-to-chip multi-signaling communication system with common conductive layer provided by the present invention utilize conductive medium such as conductive glue to glue chips to form the common conductive layer, which is different from the conventional point-to-point input/output port. The mechanism of using the common conductive layer to transmit multiple signals between chips in the present invention can transmit the signal directly to the common conductive layer, and then the receiver can selectively receive the required signal from the common conductive layer.

Compared with the present 3D IC stacking technology, the 3D IC stacking technology with a common conductive layer in direct transmission has the following features: easy design for the circuit, no extra need for pads made of multi-layer metal for overcoming stress, smaller spacing between chips that allow high density connection, and, using conductive medium to glue directly without complicated and expensive back-end processes Although the present invention has been explained in relation to its preferred embodiment, it is to be understood that many other possible modifications and variations can be made without departing from the spirit and scope of the invention as hereinafter claimed.

What is claimed is:

1. A chip-to-chip multi-signaling communication system with common conductive layer, comprising:
   a first chip having at least a first pad and a second pad;
   a second chip having at least a first pad and a second pad; and
   a common conductive layer which is to be a conductive material and is glued directly to the first chip and the second chip;
   wherein the first pad of the second chip is aligned with the first pad of the first chip for receiving the signal from the first pad of the first chip through the common conductive layer,
   wherein the signal is transmitted to the common conductive layer from the first and the second pads of the first chip, and the first and the second pads of the second chip receive the signal from the common conductive layer,
   wherein the magnitude of the signal received by the first pad of the second chip is expressed as:

$$V_{D1} = \alpha(\rho, w, s, t) \cdot V_{U1} + \beta(\rho, w, s, t) \cdot V_{U2},$$

wherein $V_{D1}$ is the magnitude of the signal received by the first pad of the second chip, $V_{U1}$ is the magnitude of the signal transmitted by the first pad of the first chip, $V_{U2}$ is the magnitude of the signal transmitted by the second pad of the first chip, $\alpha$ and $\beta$ are a ratio which is changed with different parameter designs, w is the dimension of the pads, s is the spacing between the pads located on the first or the second chip, t is the thickness of the common conductive layer, and $\rho$ is the resistivity of the common conductive layer.

2. The system as claimed in claim 1, wherein the first chip is located on an upper layer over the common conductive layer, and the second chip is located on a lower layer under the common conductive layer.

3. The system as claimed in claim 2, wherein the magnitude of the signal received by the first pad of the second chip is a function of the dimension of the pads, the spacing between the pads located on the first or the second chip, the thickness of the common conductive layer, and the arrangement of the pads.

4. The system as claimed in claim 1, wherein the magnitude of the signal received by the first pad of the second chip is expressed in an approximation as:

$$V_{D1} = \frac{(R_{M4} + R_{C22}) \| (R_{M3} + R_{C21})}{R_{M1} + (R_{M4} + R_{C22}) \| (R_{M3} + R_{C21})} \cdot \frac{R_{C21}}{R_{M3} + R_{C21}} \cdot V_{U1} + \left[ \frac{R_{M1}}{R_{M1} + (R_{M4} + R_{C22}) \| (R_{M3} + R_{C21})} \cdot \frac{R_{C21}}{R_{M3} + R_{C21}} + \frac{R_{M3}}{R_{M3} + R_{C21}} \right] \cdot V_{U2}$$

where $$R_{M1} \triangleq \frac{R_{c11} \cdot R_{c12}}{R_{c11} + R_{c12} + R_{D12}};$$

-continued $$R_{M3} \triangleq \frac{R_{c11} \cdot R_{D12}}{R_{c11} + R_{c12} + R_{D12}}; \text{ and}$$

$$R_{M4} \triangleq \frac{R_{D11} \cdot R_{c11}}{R_{c11} + R_{c12} + R_{D12}};$$

where $R_{c11}$ is the equivalent resistance between the first pad of the first chip and the first pad of the second chip, $R_{c12}$ is the equivalent resistance between the first pad of the first chip and the second pad of the second chip, $R_{D12}$ is the equivalent resistance between the first pad of the second chip and the second pad of the second chip, $R_{C21}$ is the equivalent resistance between the second pad of the first chip and the first pad of the second chip, and $R_{c22}$ is the equivalent resistance between the second pad of the first chip and the second pad of the second chip.

* * * * *